United States Patent
Haas et al.

(10) Patent No.: US 8,000,946 B2
(45) Date of Patent: Aug. 16, 2011

(54) DISCRETE EVENT SIMULATION WITH CONSTRAINT BASED SCHEDULING ANALYSIS

(75) Inventors: Martin C. Haas, Hudson, OH (US); Thomas G. Stauder, Belleville, IL (US)

(73) Assignee: The Boeing Company, Chicago, IL (US)

( * ) Notice: Subject to any disclaimer, the term of this patent is extended or adjusted under 35 U.S.C. 154(b) by 1363 days.

(21) Appl. No.: 11/533,590

(22) Filed: Sep. 20, 2006

(65) Prior Publication Data

US 2008/0126067 A1 May 29, 2008

(51) Int. Cl.
G06G 7/48 (2006.01)
G06G 7/60 (2006.01)
G06F 9/46 (2006.01)
G06F 19/00 (2011.01)

(52) U.S. Cl. ............... 703/6; 703/2; 718/102; 700/100; 700/105; 700/108; 700/111

(58) Field of Classification Search .................. 703/6, 2; 700/100; 718/102
See application file for complete search history.

(56) References Cited

U.S. PATENT DOCUMENTS

| | | | | |
|---|---|---|---|---|
| 4,796,194 A * | 1/1989 | Atherton | ....................... | 700/103 |
| 4,888,692 A * | 12/1989 | Gupta et al. | ..................... | 700/96 |
| 4,896,269 A * | 1/1990 | Tong | ............................... | 700/101 |
| 4,965,743 A * | 10/1990 | Malin et al. | ..................... | 706/45 |
| 5,093,794 A * | 3/1992 | Howie et al. | .................. | 700/100 |
| 5,195,041 A * | 3/1993 | George et al. | ................. | 700/100 |
| 5,319,781 A * | 6/1994 | Syswerda | ......................... | 705/8 |
| 5,351,195 A * | 9/1994 | Sherman | ......................... | 700/100 |
| 5,764,953 A * | 6/1998 | Collins et al. | .................... | 703/17 |
| 5,890,134 A * | 3/1999 | Fox | ................................... | 705/9 |
| 6,456,996 B1 * | 9/2002 | Crawford et al. | ...................... | 1/1 |
| 7,058,558 B2 * | 6/2006 | Reichenthal | ..................... | 703/17 |
| 7,073,175 B2 * | 7/2006 | Rehg et al. | ..................... | 718/102 |
| 7,599,755 B2 * | 10/2009 | Adra | ............................. | 700/108 |
| 2002/0184069 A1 * | 12/2002 | Kosiba et al. | ...................... | 705/8 |
| 2003/0050826 A1 * | 3/2003 | Cargille et al. | ................. | 705/10 |
| 2003/0220828 A1 * | 11/2003 | Hwang et al. | ..................... | 705/8 |
| 2006/0113839 A1 | 6/2006 | Bennett et al. | | |
| 2006/0129970 A1 * | 6/2006 | Haas et al. | ..................... | 717/104 |
| 2007/0073421 A1 * | 3/2007 | Adra | ............................... | 700/36 |
| 2008/0300705 A1 * | 12/2008 | Bagchi et al. | ................. | 700/100 |

OTHER PUBLICATIONS

Dr. James C. Emery, "Job shop scheduling by means of simulation and an optimum-seeking search" Winter Simulation Conference, 1969, pp. 363-372.*

Whitley et al., "Comparing Heuristic Search Methods and Genetic Algorithms for Warehouse Scheduling", Colorado State University, Computer Science Department, Ft. Collins, CO, 7 pages.

(Continued)

*Primary Examiner* — Kamini S Shah
*Assistant Examiner* — Akash Saxena
(74) *Attorney, Agent, or Firm* — Yee & Associates, P.C.

(57) ABSTRACT

A computer implemented method, apparatus, and computer usable program code for simulating a process. Data is received describing a process to form received data. A current discrete event simulation model is formed from the received data in a discrete event simulation engine, wherein the current discrete event simulation model includes a current schedule having a plurality of ordered tasks. A simulation of the current discrete event simulation model is performed in the discrete event simulation engine, wherein results are generated from running the current discrete event simulation model. Finally, a new schedule is generated from the current schedule and the results using schedule analysis tool.

19 Claims, 3 Drawing Sheets

OTHER PUBLICATIONS

Braune et al., "Applying Genetic Algorithms to the Optimization of Production Planning in a Real-World Manufacturing Environment", Institute of Systems Theory and Simulation, Johannes Kepler University, Austria, 6 pages.

Montana, "Introduction to the Special Issue Evolutionary Algorithms for Scheduling", BBN Technologies (GTE Internetworking), Cambridge, MA, pp. 1-5.

"Solutions & Products", Ingenious Inc., Engineering Services, http://www.ingenious.cc/?gclid=CL6H1YCFRupWAodWH612w, printed Aug. 18, 2006, pp. 1-2.

"AirFlite Fleet Manager improves an airline's profits through schedule optimization", Business Case Schedule Optimization, Sabre Airline Solutions, 2004, 2 pages.

Dorn et al., "Comparison of Iterative Improvement Techniques for Schedule Optimization", Christian Doppler Laboratory for Expert Systems, Technical University of Vienna, Austria, pp. 1-21.

\* cited by examiner

DISCRETE EVENT SIMULATION WITH CONSTRAINT BASED SCHEDULING ANALYSIS

BACKGROUND OF THE INVENTION

1. Field of the Invention

The present invention relates generally to manufacturing processes and in particular to a method and apparatus for discrete event simulation. Still more particularly, the present invention relates to a computer implemented method, apparatus, and computer usable program code for discrete event simulation of manufacturing and assembly processes.

2. Description of the Related Art

Complex projects such as the manufacturing of large commercial or tactical aircraft require the scheduling and coordination of a plurality of resources. The resources to be coordinated may include materials, component parts, personnel, machinery and factory floor space, in addition to other resources. Scheduling and coordination is particularly important in complex projects since factors such as the overall cost of the project, the time required for completion of the project, and the risk of failure must be accurately estimated. In addition, other variables of importance, such as the overall efficiency of the project, need to be accurately estimated. For example, a determination as to whether one or more resources will be under utilized or even idle for a significant amount of time are variables to be accurately determined.

In currently used scheduling analysis methods, the scheduling process generally begins with task data used to describe the tasks to be performed. This task data, for example, defines task dependencies and estimated task durations. Task dependencies generally express relationships between various tasks, so that the various tasks may be properly ordered. For example, in the construction of large commercial aircraft, a material such as an aluminum sheet material must be procured before fuselage panels may be fabricated. The task data is processed to arrange the various tasks into an ordered set of tasks for the process.

Manufacturing processes are typically dependent upon and constrained by the resources required to execute these processes along with the inherent variabilities which may exist. These dependencies and variabilities are often analyzed in advance of initiating the actual manufacturing process. This type of analysis is typically performed by creating a computer model of the process. This computer model is used to perform a simulation of the manufacturing process. A simulation involves initiating the behavior of some system by a means of an analogous model, situation, or apparatus to gain information. In other words, a simulation is a technique of building a model of a real or proposed system so that the behavior of this system may be studied under specific conditions. One benefit provided by a simulation is an ability to model the behavior of a system as time progresses.

Discrete event simulation is one way to build models to observe time-based or dynamic behaviors of a system. More specifically, discrete event simulation is a technique in which the simulation is advanced from event time to event time rather than using a continuously advancing time clock as in continuous simulations. With discrete event simulation, only points in time at which the states of the model changes are represented. In other words, a discrete event simulation models a series of events in a process. By applying appropriate parameters and running a model using discrete event simulation, the effect of factors, such as availability of limited resources and variability in task duration, may be identified.

Although currently used discrete event simulation methods and scheduling techniques are useful in creating and modeling a process prior to implementing process, the current techniques often do not take into account enough factors needed to model a process, such as a manufacturing process.

Therefore, it would be advantageous to have an improved method and apparatus for creating and performing discrete event simulations.

SUMMARY OF THE INVENTION

An embodiment of the present invention provides a computer implemented method, apparatus, and computer usable program code for simulating a process. Data is received describing a process to form received data. A current discrete event simulation model is formed from the received data in a discrete event simulation engine, wherein the current discrete event simulation model includes a current schedule having a plurality of ordered tasks. A simulation of the current discrete event simulation model is performed in the discrete event simulation engine, wherein results are generated from running the current discrete event simulation model. Finally, a new schedule is generated from the current schedule and the results using schedule analysis tool. In other embodiments, the new schedule may be generated before the simulation occurs with the new schedule being used in the initial simulation using the current discrete event simulation model.

The features, functions, and advantages can be achieved independently in various embodiments of the present invention or may be combined in yet other embodiments.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an advantageous embodiment of the present invention when read in conjunction with the accompanying drawings, wherein:

DETAILED DESCRIPTION OF THE PREFERRED EMBODIMENT

Figure 1:
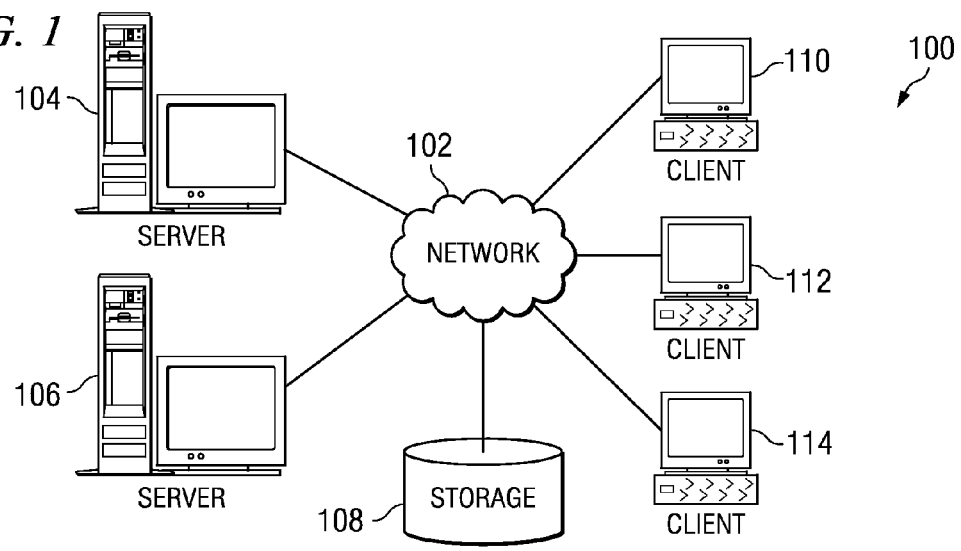
FIG. 1 is an exemplary diagram of a data processing environment in which an advantageous embodiment the present invention may be implemented.

With reference now to the figures and in particular with reference to FIG. 1, an exemplary diagram of a data processing environment is provided in which illustrative embodiments may be implemented. It should be appreciated that FIG. 1 is only exemplary and is not intended to assert or imply any limitation with regard to the environment in which different embodiments may be implemented. Many modifications to the depicted environment may be made.

FIG. 1 depicts a pictorial representation of a network of data processing systems in which illustrative embodiments may be implemented. Network data processing system 100 is a network of computers in which embodiments may be implemented. Network data processing system 100 contains network 102, which is the medium used to provide communications links between various devices and computers connected together within network data processing system 100. Network 102 may include connections, such as wire, wireless communication links, or fiber optic cables.

In the depicted example, server 104 and server 106 connect to network 102 along with storage unit 108. In addition, clients 110, 112, and 114 connect to network 102. These clients 110, 112, and 114 may be, for example, personal computers or network computers. In the depicted example, server 104 provides data, such as boot files, operating system images, and applications to clients 110, 112, and 114. Clients 110, 112, and 114 are clients to server 104 in this example. Network data processing system 100 may include additional servers, clients, and other devices not shown.

In the depicted example, network data processing system 100 is the Internet with network 102 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, network data processing system 100 also may be implemented as a number of different types of networks, such as for example, an intranet, a local area network (LAN), or a wide area network (WAN). FIG. 1 is intended as an example, and not as an architectural limitation for different embodiments.

The different processes for the advantageous embodiments of the present invention may be implemented in a server, client, or combination of server and client computers. For example, the processes and data may be located at a single client, such as client 110, alternatively, the processes for providing the simulations may be located on a server, such as server 104 with the client containing a process for providing user input and presenting output, such as through a browser program.

Figure 2:
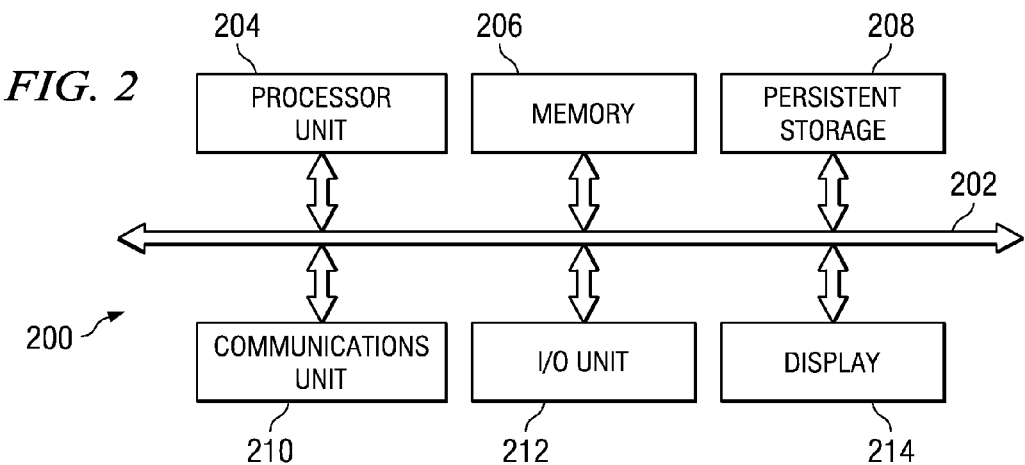
FIG. 2 is a diagram of a data processing system in accordance with an advantageous embodiment of the present invention.

Turning now to FIG. 2, a diagram of a data processing system is depicted in accordance with an advantageous embodiment of the present invention. Data processing system 200 is an example of a data processing system that may be used to implement different processes for an advantageous embodiment of the present invention.

Data processing system 200 may be used to implement client 110 or server 104 in FIG. 1. In this illustrative example, communications fabric 202 provides communications between processor unit 204, memory 206, persistent storage 208, communications unit 210, I/O unit 212, and display 214. Communications fabric 202 in these examples takes the forms of a bus. Of course, communications fabric 202 may take any form that provides communications between the different components of data processing system 200.

Processor unit 204 executes instructions for software that may be loaded into memory 206. Processor unit 204 may be a set of one or more processors or may be a multi-processor core depending on the particular implementation. Memory 206, in these examples, may be, for example, a random access memory. Persistent storage 208 may take various forms depending on the particular implementation. For example, persistent storage 208 may be, for example, a hard drive, a flash memory, a rewritable optical disk, a rewritable magnetic tape, or some combination of the above.

Communications unit 210, in these examples, provides for communications with other data processing systems or devices. In these examples, communications unit 210 is a network interface card. I/O unit 212 allows for input and output of data with other devices that may be connected to data processing system 200. For example, I/O unit 212 may provide a connection for user input though a keyboard and mouse. Further, I/O unit 212 may send output to a printer. Display 214 provides a mechanism to display information to a user.

Instructions for the operating system, the object-oriented programming system, and applications or programs are located on persistent storage 208. These instructions and may be loaded into memory 206 for execution by processor unit 204. The processes of the illustrative embodiments may be performed by processor unit 204 using computer implemented instructions, which may be located in a memory, such as memory 206.

The different advantageous embodiments of the present invention recognize that a constraining factor in nearly all manufacturing processes is that the schedule of when different tasks are to be performed is not effectively accommodated by currently used discrete event simulation engines. The different embodiments recognize that, while it is possible to mimic some aspects of a manufacturing schedule, no current discrete event simulation engine provides for optimization or analysis of this schedule. This type of analysis is typically performed using a dedicated scheduling or schedule analysis program independently of the discrete event model that is simulated through the event simulation engine. As a result, the different embodiments recognize that an ability to iteratively leverage optimizations of both the process being modeled and schedule is currently unavailable.

Thus, the advantageous embodiments of the present invention provide a computer implemented method, apparatus, and computer usable program code for a discrete event simulation in which scheduling analysis is included as part of the modeling process. Data describing a process is received to form received data. A current discrete event simulation model is formed from the received data in a discrete event simulation engine. The discrete event simulation model includes a current schedule having ordered tasks. In these examples, the schedule is a non-optimized schedule. A simulation using the current discrete event simulation model is performed in the discrete event simulation engine. This run or simulation of the model generates results. A new schedule is generated from the current schedule and the results of the simulation using a schedule analysis tool. The new schedule may be placed back into the discrete event simulation model for further simulations. The simulations and generation of schedules may be performed iteratively until some set of desired results are achieved for the simulations of the current discrete event simulation model.

In one illustrative embodiment, a communications bridge between the discrete event simulation engine and the schedule analysis tool is provided. This communications bridge provides for the use of the same data set and parameters in both types of analysis and facilitates the optimization of the schedule as part of the process of creating and modifying the discrete event simulation model. The output data of each analysis or simulation may be iteratively employed to reset or change parameters of the other analysis or simulation. For example, the scheduling analysis indirectly uses task duration variability from the discrete event simulation, while the discrete event simulation indirectly uses the task best fit protocols from the scheduling analysis.

In other words, this communications bridge uses data from the discrete event simulation to create an improved schedule from the one used in the simulation through scheduling analysis. In turn, this improved or optimized schedule is used to create a new discrete event simulation model in which the new schedule is taken into account. The new discrete event simulation model may then be run in one or more simulations to identify new data that may be used by the schedule analysis process to create another schedule that may include further improvements or optimizations to the order in which tasks are performed as compared to the prior schedule. This discrete event simulation process may be iteratively performed until a desired discrete event simulation model is created. This model may be used to create or modify the manufacturing process to implement improvements.

Figure 3:
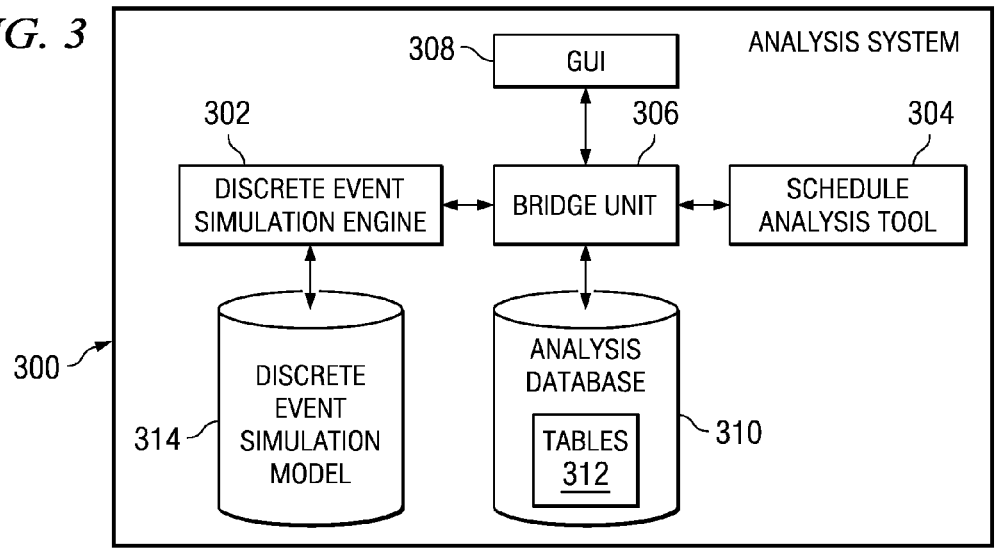
FIG. 3 is a diagram of components used to provide combined discrete event simulation and scheduling analysis in accordance with an advantageous embodiment of the present invention.

Turning now to FIG. 3, a diagram of components used to provide combined discrete event simulation and scheduling analysis is depicted in accordance with an advantageous embodiment of the present invention. In this example, analysis system 300 contains discrete event simulation engine 302 and schedule analysis tool 304. Bridge unit 306 within analysis system 300 provides a link between these two tools. Graphical user interface (GUI) 308 provides an interface for the user to input and control the analysis in these examples. Analysis database 310 contains information, such as process definition data and constraints for use by discrete event simulation engine 302 and schedule analysis tool 304.

Discrete event simulation engine 302 creates and simulates discrete event simulation models. Discrete event simulation engine 302 may be implemented using a number of currently available discrete event simulation engines. These engines are modified to communicate with bridge unit 306 in the illustrative examples. Examples of engines that may be used to implement discrete event simulation engine 302 include Quest, which is available from Delmia, Dassault Systemes Group; CSIM19, which is available from Mesquite Software; ProModel, which is available from ProModel Corporation; ARENA, which is available from Rockwell Automation; WITNESS, which is available from Lanner Group Ltd.; and FlexSim, which is available from Flexsim Software Products, Inc.

Schedule analysis tool 304 analyzes data relating to tasks to generate a schedule for performing the tasks. Schedule analysis tool 304 may be implemented using a number of currently available schedule analysis tools. For example, TimePiece, which is available from The Boeing Company; Aurora, which is available from Stottler Henke Software Solutions; AutoTask, which is available from AutoTask Corporation; ProChain, which is available from ProChain Solutions, Inc.; Primivera, which is available from Primivera Systems, Inc.; and Paragon, which is available from Paragon Software Systems, Plc.

Bridge unit 308 includes processes or functions used to initiate and control discrete event simulation engine 302 and schedule analysis tool 304. A user may implement the simulations and schedule analysis functions within analysis system 300 through GUI 308 without requiring any interaction with the different components.

Process definition data may be placed into analysis database 310 through user input into GUI 308. Analysis database 310 contains the information necessary to perform discrete event simulations and schedule analysis. This information is used both by discrete event simulation engine 302 and schedule analysis tool 304 in these examples. The data in analysis database 310 input by a user through GUI 308 may be formatted for use by discrete event simulation engine 302. Further, this same data may be formatted for use by schedule analysis tool 304.

A user may enter or identify the location of process definition data for use by discrete event simulation engine 302. The process definition data may include information, such as, for example, shift requirements, shift resources, pool resources, machine parameters and other information related to manufacturing. Additionally, the process definition data also includes a schedule containing tasks that are performed as part of the manufacturing process in these illustrative examples.

This information and other data in analysis database 310 are stored in tables 312 and are used by discrete event simulation engine 302 to create a model for discrete event simulation. Discrete event simulation is a process that allows for time-based behavior of a dynamic system to be observed. In the illustrative embodiments, a simulation model is comprised of one or more entities that are linked by logic statements. These logic statements and entities are examples of data that may be included in process definition data. Entities are tangible elements that exist in a model, such as a part of the sub-assembly of a product that passes through the manufacturing process. Alternatively, an entity may be a machine that processes a particular part or sub-assembly. Entities may be temporary or permanent. The logic statements define an act that will be performed and define the overall behavior of the model.

Bridge unit 306 sends process definition data from tables 312 in analysis database 310 to discrete event simulation engine 302. Discrete event simulation engine 302 creates discrete event simulation model 314 from this process definition data.

In performing the simulation, discrete event simulation engine 302 uses discrete event simulation model 314 to simulate the manufacturing process on an event by event basis in these examples. During the simulation, real processes are mimicked to provide output or results, which may be stored within analysis database 310 and presented to the user through GUI 308. In these examples, the process definition data entered by the user is stored in tables 312 in analysis database 310. This data is formatted as needed for the different simulations and analyses. The output from simulations and analyses also is stored in tables 312 within analysis database 310.

Discrete event simulation engine 302 may run discrete event simulation model 314 a number of times with adjustments to certain parameters between simulations to yield output data describing the performance of discrete event simulation model 314. This data is analyzed to identify the simulation with the best performance based on some pre-established criteria. The identification may be made through user input or by comparing the data with a set of rules used to identify a simulation that has best performance.

Once a selected scenario or set of parameters have been isolated, information from the results and process definition data for schedule analysis are sent from tables 312 to schedule analysis tool 304 though bridge unit 306. Bridge unit 306 places this information in a file using a format expected by schedule analysis tool 304 and sends the file to schedule analysis tool 304 to initiate the schedule analysis.

The information that may be used by schedule analysis tool 304 to generate a new schedule includes, for example, the original or current schedule in the process definition data. In addition to the tasks for the schedule defined as part of the original process definition data, information from the results of the discrete event simulation is used by schedule analysis tool 304 as part of the scheduling analysis.

Examples of information from the results in tables 312 that may be used in the scheduling analysis include how long each task in a schedule took during a simulation, and the resources used in the simulation. Also, task duration variability may be used. A task includes information, such as the identification of the task, task duration, required resources, and precedent constraints. A precedent constraint is an identification of a requirement that must occur with respect to a task. For example, one constraint may be that a selected task must be performed before the current task. Resources are, for example, manufacturing equipment, tools, human resources, or skills that are needed for the task.

The new schedule generated by schedule analysis tool 304, using the results of this simulation and the process definition data in tables 312, may be used as an input back into discrete event simulation engine 302. Schedule analysis tool 304 uses this information to perform an analysis, such as a regressive best fit assessment for sequencing of tasks within the constraints, resources, and precedents. The output of this analysis is analyzed to determine if the performance of the process has changed.

If the changes are identified as ones that should be further analyzed, the task scheduling data is then sent back to discrete event simulation engine 302 for another set of simulations. The new schedule output by schedule analysis tool 304 may be analyzed to determine if a significant change in the performance of the process is shown. In the event of an improvement in the schedule, task scheduling data is used to modify the discrete event simulation model 314. The resulting schedule generated by schedule analysis tool 304 is stored in tables 312 in analysis database 310.

This schedule may be used as an input to create a new model for discrete event simulation engine 302 to run simulations. This new model becomes discrete event simulation model 314. Alternatively, the schedule returned by schedule analysis tool 304 may be placed into tables 312 in analysis database 310. Then, a new modified model may be created from information in tables 312. Alternatively, the new model may be created though a modification of the current discrete event simulation model. As a result, the nested analyses provide a more accurate best set of circumstances for a particular manufacturing process.

Figure 4:
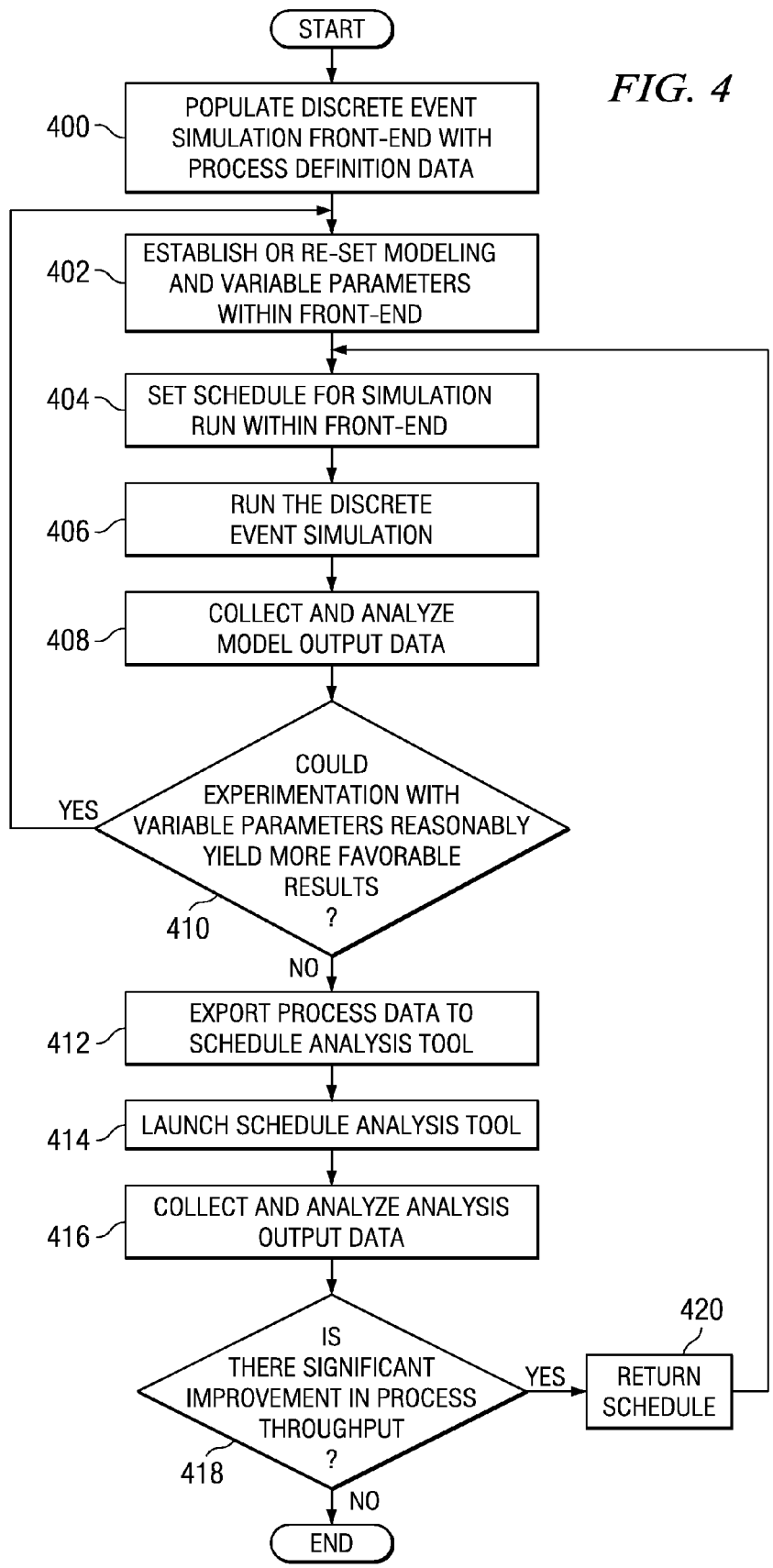
FIG. 4 is a flowchart of a process for discrete event simulation with scheduling optimization in accordance with an advantageous embodiment of the present invention.

Turning now to FIG. 4, a flowchart of a process for discrete event simulation with scheduling optimization is depicted in accordance with an advantageous embodiment of the present invention. The process illustrated in FIG. 4 may be implemented in a software component, such as bridge unit 306 in FIG. 3.

The process begins by populating the discrete event simulation front-end with process definition data (operation 400). In this operation, process definition data is populated through user input. For example, a user may define the process definition data through user input into the process or select the file containing the process definition data. In these depicted examples, the user may create a diagram or sequence of tasks directly in the process or import a file containing this type of information in the process of creating process definition data.

The process definition data may be converted or translated into a format used by the discrete event simulation engine depending on the manner in which the process definition data is received. If the user enters the process definition data through a user interface, the data is formatted. Depending on the format of the file containing the process definition data, the information may or may not need to be formatted for use by the discrete event simulation engine.

Modeling parameters within the front-end are established or re-set (operation 402). In operation 402, the user may add parameters for discrete event simulation. For example, the user may input parameters controlling task behavior, such as whether a task has to wait for another task. Other parameters may control variability in model elements, such as task duration time, resource performance, and/or the effect of learning. The front end is a component, such as bridge unit 306 in FIG. 3 in these examples. These parameters are stored with other process definition data in tables, such as tables 312 in FIG. 3.

Then, a schedule for simulation run within the front-end is set (operation 404). An example of this type of information for the schedule is the setting of production units and how the simulation will run. In this particular operation, the user may select a schedule. For example, the user may specify that one-hundred units are built in lots of ten and a new lot is started every other day. Alternatively, this schedule may indicate that specific dates should be used to start assembly.

Next, the discrete event simulation is run (operation 406). In operation 406, the process engages the discrete event simulation engine to build the discrete event simulation model and run the simulation using the model. Model output data is then collected for analysis (operation 408). The result of operation 408 is a collection of output data. This data may include, for example, how long a unit took to produce and how long each task took. Other information that may be collected includes the resources used to produce a unit. As a part of operation 408, the collected data may be formatted into a report for analysis. The output data is stored in tables, such as tables 312 in FIG. 3 in these examples. In this manner, the output data may be used as inputs into a schedule analysis tool in these examples.

Thereafter, a determination is made as to whether the experimentation with the variable parameters could reasonably yield more favorable results (operation 410). Based on analysis of the output data, an evaluation of the simulated results is made with respect to pre-established criteria. In this operation, the user determines if the output results approach or represent a best case scenario. This best case is selected based on some policy.

In this example, the policy is a set of rules defining what is considered a best case for this particular model. These rules may be a set of default rules previously selected or based on user input. Further, depending on the particular implementation, the policy may be a user input selecting a particular run or simulation of the discrete event simulation model. Based on this evaluation, the user may choose to iteratively re-set any combination of model parameters or variables and run the simulation again with the process returning to operation 402. This determination is made with user input in these examples. Depending on the implementation, operation 410 may be a computer implemented operation that is made based on a policy that is applied to the results. The policy could set out rules that determine whether the output data meet some threshold for one or more factors, such as resource usage or completion time.

When the user is satisfied that the best simulation run has been identified, the output data for that particular run or execution is exported or sent for use by the schedule analysis tool (operation 412). In operation 412, the data from the tables are formatted and placed into a file for use by the schedule analysis tool. These data will be representative of the conditions used by the simulation run. For example, any task which had a variable duration input to the simulation model will use the actual discrete time generated in that best case simulation run.

Afterwards, the schedule analysis tool is launched (operation 414). The schedule analysis tool is run with information identified from the discrete event simulation of the discrete event simulation model. This schedule analysis tool generates an optimal schedule based on the process definition data received in operation 400 and the output data selected in operation 410. The analysis output data is collected and analyzed (operation 416). The results from running the schedule analysis tool in operation 414 are analyzed. The process determines whether a difference between the original schedule and the schedule resulting from running the schedule analysis tool is present.

Thereafter, a determination is made as to whether a significant improvement in process throughput is present (operation 418). The determination as to whether a significant improvement in the process throughput is also based on a policy. This policy is a set of rules used to determine whether enough improvement has occurred. The rules may set standards or thresholds as to what improvements in the schedule are considered significant. For example, if certain tasks can be shortened by some selected period of time or some percentage, the new schedule may be considered.

Further, if the overall time needed to perform the tasks is reduced by some selected amount of time or some percentage, the change in the schedule may be considered significant. Of course, other standards and rules may be used depending on the particular implementation. Although operation 418 determines whether a "significant" improvement occurs, the process could be an implementation in which any improvement is used to update the discrete event simulation model.

If significant improvement in process throughput is present in operation 418, the process returns the schedule (operation 420) and then returns to operation 404 to set the schedule for the simulation run within the front-end. If significant improvement is not seen in operation 418, the process terminates.

Although this particular example illustrates running a simulation prior to optimizing a schedule, the different illustrative embodiments may generate a schedule first from the information in the tables. The output from the schedule analysis tool is then input back into the tables for the discrete event simulation engine to use in creating a discrete event simulation model. The order in which the simulation and analysis are run may differ depending on the particular implementation. The particular example in FIG. 4 is meant to illustrate one advantageous embodiment of the present invention and is not to limit the order in which the simulation and analysis using the discrete event simulation and the schedule analysis tool are run.

Figure 5:
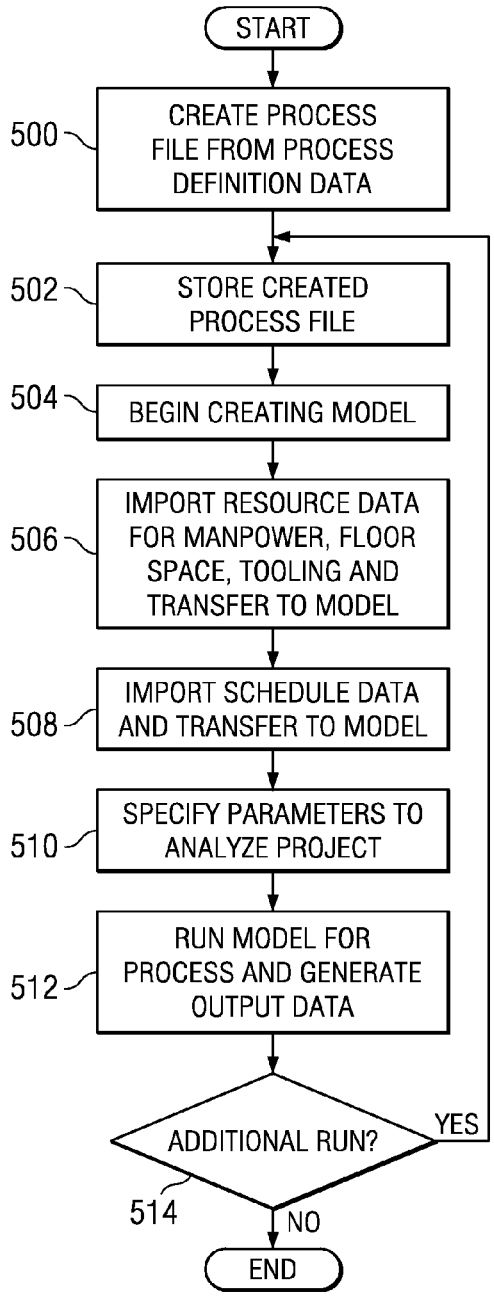
FIG. 5 is a flowchart of a process for creating a discrete event simulation model and running simulations using the model in accordance with an advantageous embodiment of the present invention.

Turning now to FIG. 5, a flowchart of a process for creating a discrete event simulation model and running simulations using the model is depicted in accordance with an advantageous embodiment of the present invention. The process illustrated in FIG. 5 may be implemented in a software component, such as discrete event simulation engine 302 in FIG. 3.

The process begins by creating a process file from process definition data (operation 500). In this operation, the process definition data from tables, such as tables 312 in FIG. 3, is placed into a format that is usable by the discrete event simulation engine. This file may include, for example, an order definition of tasks required for the definition of the process, start events, end events, predecessor tasks for task elements and successor tasks for task elements. The created process file is then stored (operation 502).

The process begins creating the discrete event simulation model using the process file (operation 504). In operation 504, the discrete event simulation engine creates a model that will be used in the simulation. Resource data is imported for resources such as manpower, floor space, and tooling and then transferred to the model (operation 506). In operation 506, the resource data includes, for example, manpower requirements, manpower availability, factory floor space availability, tooling requirements and other resources required for the manufacturing process.

Next, schedule data is imported from the file and transferred to the discrete event simulation model (operation 508). The schedule data imported in operation 508 includes, for example, manufacturing dates, manufacturing days available for scheduling the process, a lot size for the process, a target completion data for the process, and other types of similar data. Further, a learning curve for the process also may be specified in this operation. A learning curve reflects the positive effect of increasing familiarity with the process for the manpower resources that may implement the process.

Parameters are specified to analyze the project (operation 510). In operation 510, these parameters may include, for example, the number of times to execute or simulate the model. Further, variability in parameters, such as cycle times, labor performance, and rework tasks may be placed into the model at this point. A simulation is run using the discrete event simulation model runs simulations to generate output (operation 512). The output data provides a description of the behavior of the process over time including variations in the process. This output data may be formatted for display or presentation to users. In this example, the output data is output into tables, such as tables 312 in FIG. 3.

Finally, a determination is made as to whether an additional run is necessary (operation 514). Any user input received for operation 514 may be received through an interface, such as bridge unit 306 in FIG. 3. This component provides a single interface from the user to control all aspects of the process in these examples. The interface then sends the appropriate commands or data to the process. Operation 514 allows a user to request additional execution of the same or different mode.

If an additional run is necessary, the process returns to operation 502 and processes as described above. If an additional run is not necessary in operation 514, the process terminates. More information on discrete event simulation may be found in Haas et al., *Systems and Methods for Production Planning Analysis using Discrete Event Simulation*, filed Nov. 30, 2004, Ser. No. 10/999,626, which is incorporated herein by reference.

Figure 6:
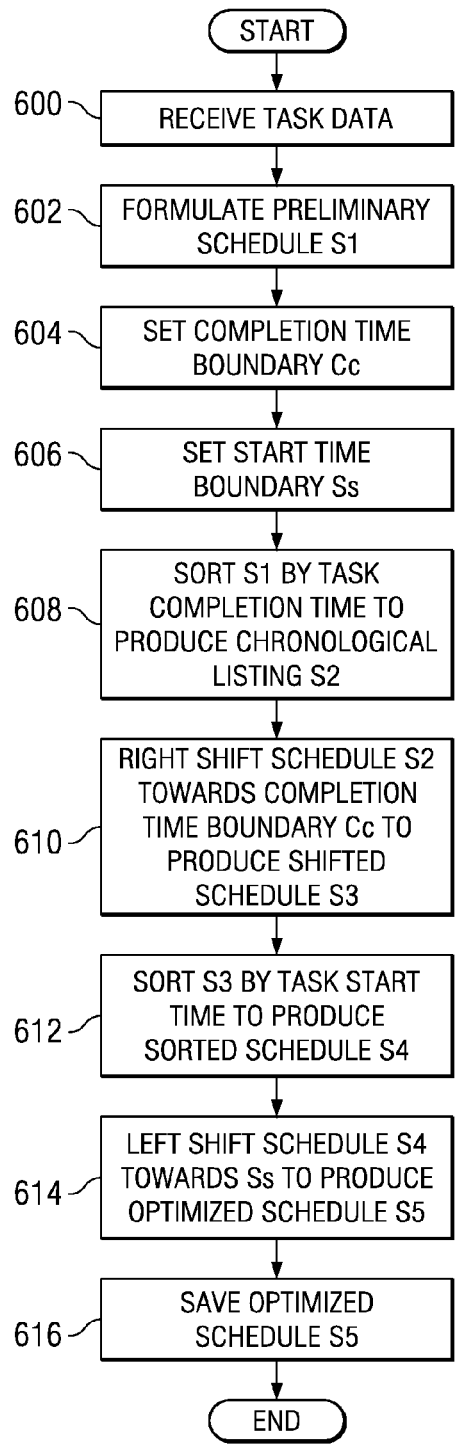
FIG. 6 is a flowchart of a process for generating a schedule in accordance with an advantageous embodiment of the present invention.

Turning now to FIG. 6, a flowchart of a process for generating a schedule is depicted in accordance with an advantageous embodiment of the present invention. The process illustrated in FIG. 6 may be implemented in a software component, such as schedule analysis tool 304 in FIG. 3.

The process begins by receiving task data (operation 600). In operation 600, the task data includes information about the task that is to be processed with other tasks to generate a schedule. Each task may include information, such as, for example, the identification of the task, the task duration, the required resources, and the precedent constraints applicable to the task. In these examples, the task data may be information received from information in tables, such as tables 312 in FIG. 3. This information may include, for example, process definition data and output data generated from the simulation of the model. The information needed from these sources may be identified through an interface, such as bridge unit 306 in FIG. 3. The information from the tables is formatted and placed into a file in a format that is expected by schedule analysis tool 304 in FIG. 3 to run the analysis. In this manner, the information may be automatically transferred form the discrete event simulation engine to the schedule analysis tool without requiring a user input.

Next, a preliminary schedule S1 is formulated (operation 602). This preliminary schedule is an initial schedule that is set up for analysis and optimization by subsequent operations in this process. The completion time boundary Cc is set (operation 604). In operation 604, the latest completion time for any task listed in preliminary schedule S1 is identified and set as a right boundary, which is completion time boundary Cc.

The start time boundary Ss is set (operation 606). The start time boundary Ss is set as the earliest start time for any of the tasks listed in the task data. The preliminary schedule S1 is sorted by task completion time to produce a chronological listing S2 (operation 608). In operation 608, the different tasks are placed into chronological order by completion time for each task to produce a chronological listing S2.

Then, the chronological listing S2 is right shifted towards the completion time boundary Cc to produce a shifted schedule S3 (operation 610). In operation 610, the process works in reverse chronological order in the chronological listing and right shifts each task as much as possible to the right completion time boundary. This process begins with the last task in the list. This last task is the task with the latest completion time. In performing this operation, each task is unscheduled and rescheduled to start and finish as late as possible prior to or at the right time boundary, which is completion time boundary Cc as determined in operation 604. This process is performed without validating any applicable constraints and requirements associated with each respective task.

Thereafter, shifted schedule S3 is sorted by task start time to produce sorted schedule S4 (operation 612). In operation 612, the tasks in shifted schedule S3 are sorted by start time to produce sorted schedule S4. The sorted schedule S4 is left shifted towards the start time boundary Ss to produce an optimized schedule S5 (operation 614). In operation 614, a left shift is performed to shift the start time of each task as much as possible towards the start time boundary identified in operation 606. The process in this operation starts with the first task in the list, which is the task having the first start time. Each task is unscheduled and rescheduled to occur as early as possible, but no earlier than the start time boundary. This process is performed without violating applicable constraints and requirements associated with each respective task. As a result, each task is provided a new start time resulting in optimized schedule S5. Finally, the optimized schedule S5 is saved (operation 616). In operation 616, the optimized schedule is saved back into the tables. At this point, this optimized schedule may be used in running additional simulations using the discrete event simulation engine.

The optimized schedule may include, for example, shortening the time needed for the entire process or shortening particular tasks of interest. Further, the optimized schedule may include improvements in resource usage. For example, the resource usage may be improved by higher resource utilizations or more consistent resource usage through changes in the schedule. The schedule may be optimized to have level resource utilizations rather than utilizations that have peaks and valleys. Further, throughput also may be improved in the schedule by having consistent times between finished good deliveries to help smooth out planning on the manufacturing floor. Of course, the types of optimizations that may be considered an improved schedule may differ depending on the particular implementation.

The process illustrated in FIG. 6 depicts one manner in which a schedule may be optimized. Other types of schedule optimization processes may be used depending on the implementation. More information on schedule analysis tools may be found in U.S. Pat. No. 5,890,134, which is incorporated herein by reference.

The flowcharts and block diagrams in the different depicted embodiments illustrate the architecture, functionality, and operation of some possible implementations of apparatus, methods and computer program products. In this regard, each block in the flowchart or block diagrams may represent a module, segment, or portion of code, which comprises one or more executable instructions for implementing the specified function or functions. In some alternative implementations, the function or functions noted in the block may occur out of the order noted in the figures. For example, in some cases, two blocks shown in succession may be executed substantially concurrently, or the blocks may sometimes be executed in the reverse order, depending upon the functionality involved.

Thus, the advantageous embodiments of the present invention provide a computer implemented method, apparatus, and computer usable program product for simulating a process. Data describing a production process is received to for received data. A current discrete event simulation model is formed from the received data using a discrete event simulation engine. The current discrete event simulation model includes a current schedule having ordered tasks. A simulation is run using the current discrete event simulation model is performed in the discrete event simulation engine. This run or simulation using the model generates results. A new schedule is generated from the current schedule and the results using a schedule analysis tool. In these illustrative examples, the production process may be, for example, a manufacturing process and/or an assembly process.

In the depicted examples, the information used by the discrete event simulation engine and the schedule analysis tool are both derived from tables by the bridge unit. Of course, the information may be stored in other formats other than tables. For example, the information may be stored as entries in a database. The bridge unit formats the data into a form expected by each of the components when the data is sent to those components for running a simulation or for analysis. The output of each of these components is placed back into tables and may be used with the other information as input by the other components. The step of performing a run or simulation may be repeated in which new results are generates from writing the current discrete event simulation model.

Although the described embodiments run the simulation prior to performing an analysis on the schedule, the analysis of the schedule may be performed prior to the simulation, depending on the particular implementation.

In this manner, the different advantageous embodiments of the present invention allow for an improved or optimized schedule to be taken into account in a discrete event simulation model in which data for generating the schedule is obtained from simulations of the model. These steps of running simulations with the model, taking data from the model, creating an improved or new schedule, and using a new schedule to modify the model for further simulation may be performed iteratively until some results are generated for the discrete event simulation model.

Further, the different advantageous embodiments of the present invention provide a further advantage in that a user may perform all of these processes through a single interface without requiring a user to know how to use the different components. Additionally, the different advantageous embodiments may be applied to other processes other than manufacturing processes. For example, the different embodiments may be applied to a process for assembling goods or a process for coding software.

The different advantageous embodiments of the present invention may take the form of an entirely hardware embodiment, an entirely software embodiment or an embodiment containing both hardware and software elements. One advantageous embodiment is implemented in software, which includes but is not limited to forms such as firmware, resident software, and microcode.

Furthermore, the different embodiments of the present invention may take the form of a computer program product located on a computer-usable or computer-readable medium in which program code or instructions forming the computer program product are for use by a data processing system, such as a computer or other device having a processor unit capable or executing the code or instructions.

In the different embodiments, a computer-usable or computer readable medium may be any tangible or physical apparatus that can contain, store, communicate, propagate, and/or transport the computer program product. The computer readable medium may be an electronic, magnetic, optical, electromagnetic, infrared semiconductor system, or a propagation medium. Examples of a computer-readable medium include a semiconductor or solid state memory, magnetic tape, a removable computer diskette, a random access memory (RAM), a read-only memory (ROM), a hard disk, and an optical disk.

The description of the present invention has been presented for purposes of illustration and description, and is not intended to be exhaustive or limited to the invention in the form disclosed. Many modifications and variations will be apparent to those of ordinary skill in the art. Further, different advantageous embodiments may provide different advantages as compared to other advantageous embodiments. The embodiment or embodiments selected are chosen and described in order to best explain the principles of the invention, the practical application, and to enable others of ordinary skill in the art to understand the invention for various embodiments with various modifications as are suited to the particular use contemplated.

What is claimed is:

1. A computer program product comprising:
   a non-transitory computer readable medium having computer usable program code for simulating a manufacturing process, the computer program medium comprising:
   a first program module, wherein the first program module creates a discrete event simulation model from process definition data and runs simulations using the discrete event simulation model, wherein the discrete event simulation model includes a current schedule;
   a second program module, wherein the second program module analyzes task information to generate a schedule; and
   a third program module, wherein the third program module receives the process definition data for a manufacturing process, sends the process definition data to the first program module to initiate creation of the discrete event simulation model, initiates running of a first simulation using the discrete event simulation model to produce results, determines whether the results meet a threshold, sends information from the results and the discrete event simulation model to the second program module to cause the second module to generate a new schedule in response to a determination that the results meet a threshold, sends the new schedule to the first program module to cause creation of a new discrete event simulation model including the new schedule, determines whether the new schedule meets a desired threshold of reduction in time compared to the current schedule, and initiates running of a second simulation using the first program module to generate new results in response to a determination that the new schedule does not meet the desired threshold of reduction in time of the process compared to the current schedule.

2. The computer program product of claim 1, wherein the third program module initiates additional iterations in which simulations of the discrete event simulation model are run, new schedules are generated using the results from the simulations, new discrete event simulation models are created from the new schedules, and additional simulations are run until a desired discrete event simulation model is generated.

3. The computer program product of claim 1, wherein the first program module is a discrete event simulation engine and wherein the second program module is a schedule analysis tool.

4. The computer program product of claim 1, wherein the third program module displays a graphic user interface to receive user input to control the simulating of the manufacturing process and to present information and the results.

5. A computer implemented method for simulating a process, the computer implemented method comprising:
   receiving data describing a process to form received data;
   forming a current discrete event simulation model from the received data in a discrete event simulation engine, wherein the current discrete event simulation model includes a current schedule having a plurality of ordered tasks;
   performing a simulation using the current discrete event simulation model in the discrete event simulation engine, wherein results are generated from running the current discrete event simulation model;
   determining whether the results meet a threshold;
   responsive to a determination that the results do not meet the threshold, repeating the forming and performing steps;
   responsive to a determination that the results meet the threshold, generating a new schedule from the current schedule and the results using a schedule analysis tool;
   determining whether the new schedule meets a desired threshold of reduction in time compared to the current schedule; and
   responsive to a determination that the new schedule does not meet the desired threshold of reduction in time of the process compared to the current schedule, repeating the forming, performing, and generating steps.

6. The computer implemented method of claim 5, wherein an initial schedule is generated prior to performing the simulation and wherein the initial schedule is used as the current schedule for the current discrete event simulation model.

7. The computer implemented method of claim 5 further comprising:
   forming a new discrete event simulation model from the current discrete event simulation model and the initial schedule, wherein the new discrete event simulation model becomes the current discrete event simulation model; and
   repeating the performing step, wherein new results are generated from running the current discrete event simulation model.

8. The computer implemented method of claim 7 further comprising:
   initiating the forming step if the new schedule meets a policy.

9. The computer implemented method of claim 5, wherein the process is a production process.

10. The computer implemented method of claim 9, wherein the production process is at least one of a manufacturing process and an assembly process.

11. The computer implemented method of claim 5, wherein the receiving step comprises:
   presenting a graphical user interface; and
   receiving the data through the graphical user interface.

12. The computer implemented method of claim 5, wherein the receiving, forming, performing, and generating steps are performed using a software interface, wherein the software interface provides an interface between the discrete event simulation model and the schedule analysis tool.

13. A computer program product comprising:
   a non-transitory computer readable medium having computer readable program code for simulating a process, the computer program medium comprising:
   computer readable program code for receiving data describing a process to form received data;
   computer readable program code for forming a current discrete event simulation model from the received data in a discrete event simulation engine, wherein the current discrete event simulation model includes a current schedule having a plurality of ordered tasks;
   computer readable program code for performing a run of the current discrete event simulation model in the discrete event simulation engine, wherein results are generated from running the current discrete event simulation model;
   computer readable program code for determining whether the results meet a threshold;
   responsive to a determination that the results do not meet the threshold, computer readable program code for repeating the forming and performing steps;
   responsive to a determination that the results meet the threshold, computer readable program code for generating a new schedule from the current schedule and the results using schedule analysis tool;
   computer readable program code for determining whether the new schedule meets a desired threshold of reduction in time compared to the current schedule; and
   responsive to a determination that the new schedule does not meet the desired threshold of reduction in time of the process compared to the current schedule, computer readable program code for repeating the forming, performing, and generating steps.

14. The computer program product of claim 13, wherein an initial schedule is generated prior to performing the simulation and wherein the initial schedule is used as the current schedule for the current discrete event simulation model.

15. The computer program product of claim 13 further comprising:
   computer readable program code for forming a new discrete event simulation model from the current discrete event simulation model and the initial schedule, wherein the new discrete event simulation model becomes the current discrete event simulation model; and
   computer readable program code for repeating execution of the computer program code for performing a run of the current discrete event simulation model in the discrete event simulation engine, and wherein results are generated from running the current discrete event simulation model, wherein new results are generated from running the current discrete event simulation model.

16. The computer program product of claim 15 further comprising:
   computer readable program code for initiating the computer useable program code for forming a current discrete event simulation model from the received data in a discrete event simulation engine, wherein the current discrete event simulation model includes a current schedule having a plurality of ordered tasks if the new schedule meets a policy.

17. The computer program product of claim 15 further comprising:
   computer readable program code for repeating execution of the computer readable program code for performing a run of the current discrete event simulation model in the discrete event simulation engine, computer readable program code for generating a new schedule from the current schedule and the results using schedule analysis tool, computer readable program code for forming a current discrete event simulation model from the received data in a discrete event simulation engine, and computer readable program code for repeating execution of the computer readable program code for performing a run of the current discrete event simulation model in the discrete event simulation engine until desired results are generated.

18. The computer program product of claim 13, wherein the process is a production process.

19. The computer program product of claim 18, wherein the production process is at least one of a manufacturing process and an assembly process.

* * * * *